(12) United States Patent
Buehler et al.

(10) Patent No.: US 8,536,773 B2
(45) Date of Patent: Sep. 17, 2013

(54) ELECTRON BEAM SOURCE AND METHOD OF MANUFACTURING THE SAME

(75) Inventors: Wolfram Buehler, Hermaringen (DE); Volker Drexel, Koenigsbronn (DE)

(73) Assignee: Carl Zeiss Microscopy GmbH, Jena (DE)

( * ) Notice: Subject to any disclaimer, the term of this patent is extended or adjusted under 35 U.S.C. 154(b) by 82 days.

(21) Appl. No.: 13/075,325

(22) Filed: Mar. 30, 2011

(65) Prior Publication Data
US 2012/0248959 A1    Oct. 4, 2012

(51) Int. Cl.
*H01J 19/06*    (2006.01)
*H01K 1/04*    (2006.01)

(52) U.S. Cl.
USPC .................. 313/346 R; 250/307; 250/310

(58) Field of Classification Search
USPC .............. 313/310, 311, 309, 306, 307, 495, 313/496, 497, 13, 346 R; 250/310, 311, 250/307
See application file for complete search history.

(56) References Cited

U.S. PATENT DOCUMENTS

| | | | |
|---|---|---|---|
| 4,008,412 A * | 2/1977 | Yuito et al. ................ 313/309 |
| 5,584,739 A | 12/1996 | Itoh et al. |
| 5,773,921 A | 6/1998 | Keesmann et al. |
| 5,825,126 A | 10/1998 | Kim |
| 6,033,924 A | 3/2000 | Pack et al. |
| 6,091,190 A * | 7/2000 | Chalamala et al. ....... 313/346 R |
| 6,383,923 B1 | 5/2002 | Brown et al. |
| 6,392,333 B1 * | 5/2002 | Veneklasen et al. ....... 313/361.1 |
| 6,861,791 B1 | 3/2005 | Givargizov et al. |
| 7,288,773 B2 | 10/2007 | De Jonge et al. |
| 7,388,201 B2 | 6/2008 | Cholewa et al. |
| 7,821,187 B1 * | 10/2010 | Jiang et al. ................. 313/361.1 |
| 7,888,654 B2 | 2/2011 | Tessner et al. |
| 8,080,930 B2 | 12/2011 | King |
| 2001/0024078 A1 | 9/2001 | Dimitrijevic et al. |
| 2002/0006489 A1 | 1/2002 | Goth et al. |
| 2002/0076846 A1 | 6/2002 | Ihm |
| 2005/0062389 A1 * | 3/2005 | Davidson et al. ............. 313/309 |
| 2006/0076504 A1 | 4/2006 | De Jonge et al. |
| 2006/0123894 A1 | 6/2006 | Krause et al. |

(Continued)

FOREIGN PATENT DOCUMENTS

| | | |
|---|---|---|
| DE | 101 22 602 A1 | 7/2002 |
| DE | 103 22 005 A1 | 12/2004 |

(Continued)

OTHER PUBLICATIONS

Daniel T. Pierce, "Spin-Polarized Electron Microscopy", Physica Scripta, vol. 38, 1988, pp. 291 to 296 (see description p. 22, line 12).

(Continued)

*Primary Examiner* — Mariceli Santiago
*Assistant Examiner* — Glenn Zimmerman
(74) *Attorney, Agent, or Firm* — Fish & Richardson P.C.

(57) ABSTRACT

An electron beam source includes a base and a tip fixed to the base and extending from the base. The tip includes a core and a coating applied to the core. The core has a surface that includes a first material. The coating includes a second material which is different from the first material. The second material forms a surface of the tip, and the second coating includes more than 30% by weight of a lanthanide element.

22 Claims, 8 Drawing Sheets

(56) References Cited

U.S. PATENT DOCUMENTS

| | | |
|---|---|---|
| 2006/0146905 A1* | 7/2006 | Skinner et al. .................. 372/55 |
| 2006/0267475 A1 | 11/2006 | Visser et al. |
| 2007/0024180 A1 | 2/2007 | Choi et al. |
| 2007/0085813 A1* | 4/2007 | Lee ............................... 345/101 |
| 2008/0029700 A1 | 2/2008 | Fujieda et al. |
| 2008/0054790 A1* | 3/2008 | Kim et al. ..................... 313/491 |
| 2008/0174225 A1* | 7/2008 | Tessner et al. .............. 313/362.1 |
| 2010/0078557 A1 | 4/2010 | Drexel et al. |
| 2010/0193687 A1* | 8/2010 | Fujieda et al. ................. 250/310 |
| 2011/0139984 A1* | 6/2011 | Kurata ........................... 250/310 |
| 2012/0131785 A1 | 5/2012 | Drexel et al. |
| 2012/0170718 A1* | 7/2012 | Travish et al. ................. 378/122 |

FOREIGN PATENT DOCUMENTS

| | | |
|---|---|---|
| DE | 103 42 644 A1 | 4/2005 |
| DE | 203 21 217 U1 | 11/2006 |
| DE | 10 2006 008 858 A1 | 9/2007 |
| DE | 10 2007 010 462 A1 | 9/2008 |
| DE | 10 2007 010 463 A1 | 9/2008 |
| EP | 1 672 648 A1 | 6/2006 |
| JP | 2007-258172 A | 10/2007 |
| WO | WO 95/23424 | 8/1995 |
| WO | WO 2009/111149 | 9/2009 |

OTHER PUBLICATIONS

Daniel T. Pierce, "Spin-Polarized Electron Microscopy", Physica Scripta, vol. 38, 1988, pp. 291 to 296 (see description p. 19, line 2.).

http://en.wikipedia.org/wiki/Diamond-like_carbon (Reference 1) (7 pages) Jul. 30, 2008.

T. Utsumi: "Keynote Address Vacuum Microelectronics: What's New and Exciting"; IEEE Transactions on Electron Devices, vol. 38, No. 10, Oct. 1991, pp. 2276-2283.

W. I. Milne: "CNTs as Electron Emitters for Field Emission Displays"; Lasers and Electro-Optics Society, 18th Annual Meeting of the IEEE, 2005, pp. 654-655.

I. Kleps et al.: "Field emission properties of silicon carbide and diamond-like carbon (DLC) films made by chemical vapour deposition techniques"; Applied Surface Science 146, 1999, pp. 152-157.

* cited by examiner

ELECTRON BEAM SOURCE AND METHOD OF MANUFACTURING THE SAME

FIELD

The disclosure relates to an electron beam source and to a method of manufacturing and using an electron beam source. The electron beam source can be capable of providing an electron beam having a high brightness and/or a small energy spread.

BACKGROUND

Conventional electron beam sources include an electrode from which an electron beam may be extracted by exposing the electrode to an electrical potential, a thermal excitation, a photonic excitation or a combination of an electrical potential, thermal excitation and photonic excitation.

SUMMARY

In some embodiments, the disclosure provides an electron beam source including an electrode tip having a comparatively small radius.

In certain embodiments, the disclosure provides an electron beam source which can be easily manufactured or handled.

In some embodiments, the disclosure provides an electron beam source which has high durability.

In some embodiments, an electron beam source is provided having a tip which includes a core. The core is at least partially provided with a conductive coating.

In certain embodiments, the surface of the core is formed of a material having a lower electrical conductance than the material of the coating. Since the tip of the electron beam source may be very small, it may be difficult to measure the conductivities of the materials from which the tip is formed at the tip itself. In the context of the present disclosure, values of conductivities or values of a modulus of elasticity of materials which are employed for forming the tip therefore relate to values of resistance and modulus of elasticity, respectively, which may be measured in the bulk of the respective material.

In some embodiments, a further material having a comparatively lower electrical conductivity is provided below the coating of the comparatively conductive material which at least partially provides the surface of the tip. It is possible that the coating of the material having the greater conductivity is directly applied onto a surface formed by the further material having the comparatively lower conductivity and that both materials directly contact each other. However, it is also possible that a layer from still a further material is arranged between the two above-noted materials, for example to improve an adherence of the coating made from the material having the greater conductivity at the material having the lower conductivity.

In certain embodiments, the core whose surface is provided by the material having the lower conductivity and on which the coating made of the material having the higher conductivity is applied consists of an inner core and a layer of the material having the lower conductivity applied thereon. Thereby, the inner core is formed from a third material which may be different from the material having the lower conductivity and which in particular may have a higher electrical conductivity than the material having the lower conductivity.

In some embodiments, the third material of which the inner core is made has a modulus of elasticity of greater than 150 kN/mm$^2$ (e.g., greater than 300 kN/mm$^2$, greater than 600 kN/mm$^2$, greater than 700 kN/mm$^2$).

The elastic modulus of an object is defined as the slope of its stress-strain curve in the elastic deformation region, i.e. the ratio between the force causing a deformation divided by an area to which the force is applied and the ratio of a change caused by the stress to an original state of the object. The elastic modulus of a material may be measured by applying a pressure along an axis and determining a relative deformation of the material along that axis.

In particular the modulus of elasticity of the third material may be greater than that of plastic material. In particular the hardness of the third material is greater than that of plastic material. Thus, the tip is rigid to withstand forces acting on the tip when an electric field is generated. Therefore the shape of the tip and the shape of the entire electron source is maintained and thus the distribution of the electric field generated is substantially maintained to favourably emit electrons.

In certain embodiments, the third material of which the inner core is made has a modulus of elasticity of less than 1100 kN/mm$^2$ (e.g., less than 1000 kN/mm$^2$, less than 800 kN/mm$^2$). The third material may be diamond like carbon which has a modulus of elasticity of about 770 kN/mm$^2$.

In some embodiments, a center of the core is formed of first material which may have a modulus of elasticity of greater than 150 kN/mm$^2$ (e.g., greater than 300 kN/mm$^2$, greater than 600 kN/mm$^2$, greater than 700 kN/mm$^2$). The first material may have a modulus of elasticity of less than 1100 kN/mm$^2$ (e.g., less than 1000 kN/mm$^2$, less than 800 kN/mm$^2$).

In certain embodiments, the layer from the first material on the inner core has a thickness of more than a monolayer from the layer material. Exemplary thicknesses are in ranges from 0.1 nm to 100 nm, such as from 1 nm to 50 nm, or from 1 nm to 30 nm.

The coating from the material having the greater conductivity applied to the core may have a thickness of 2 nm to 50 nm (e.g., from 2 nm to 30 nm, from 20 nm to 50 nm). In some embodiments, the tip is fixed at the base and its end extending away from the base has a surface having a small radius of curvature. In some embodiments, the radius of curvature is less than 100 nm (e.g. less than 80 nm, less than 60 nm). In certain embodiments, the radius of curvature is greater than 5 nm, such as greater than 10 nm.

In some embodiments, a maximum dimension of the tip in its longitudinal direction may be greater than 50 nm (e.g., greater than 100 nm, or greater than 300 nm). In certain embodiments, a maximum dimension of the tip in its transversal direction may be less than 500 nm (e.g., less than 200 nm, less than 100 nm, or less than 50 nm).

In certain embodiments, a ratio between the extension of the tip in the longitudinal direction and the dimension of the tip in the transversal direction (aspect ratio) may be greater than 2:1 (e.g., greater than 5:1, greater than 10:1, or still greater). Further, the tip may taper towards its end.

In some embodiments, an electrical conductivity of a material at least partially providing the surface of the tip may be greater than $10^{-7}$ S/m (e.g., greater than $10^{-5}$ S/m, greater than $10^{-3}$ S/m, greater than $10^{-1}$ S/m, greater than $10^2$ S/m, greater than $10^4$ S/m, or greater than $10^6$ S/m).

In certain embodiments, a material providing a surface of a core of the tip onto which core a coating from a material having a comparatively greater electrical conductivity is applied may have an electrical conductivity which is less than $10^5$ S/m (e.g., less than $10^3$ S/m, less than 10 S/m, less than $10^{-1}$ S/m, less than $10^{-3}$ S/m, less than $10^{-5}$ S/m or less than $10^{-7}$ S/m).

In some embodiments, a ratio between an electrical conductivity of a coating material applied onto a core of a tip of an electron beam source and an electrical conductivity of a material onto which the coating is applied may be greater than 10:1 (e.g., greater than 100:1, greater than $10^4$:1, greater than $10^6$:1, or greater than $10^8$:1).

In certain embodiments, a material onto which a coating of a tip of an electron beam source is applied is formed from diamond like carbon material. Diamond like carbon material is amorphous carbon material having some of the properties of natural diamond. In particular, diamond like carbon includes substantial amounts of $sp^3$-hybridized carbon atoms. Today seven forms of diamond like carbon are known. Of these seven forms, there are three hydrogen free forms which are denoted as a-C, pa-C, and a-C:Me, where the latter includes a metal (Me) as dopant. Of the seven forms, there are four hydrogenated, hydrogen including forms, which are denoted as a-C:H, ta-C:H, a-C:H:Me, and a-C:H:X, wherein the two latter include a metal (Me) and other elements (X), respectively, as dopant. The metals Me may include tungsten, titanium, gold, molybdenum, iron and chromium, among others, and the other elements X may include silicon, oxygen, nitrogen, fluorine, and boron among others.

There are different methods known for manufacturing diamond like carbon. These methods have in common, that the material is deposited onto a substrate, where pressure, energy, catalysis, or a combination of the same is used to deposit atoms so that these atoms form a $sp^3$-bond with already deposited carbon atoms to a significant percentage.

In some embodiments, a diamond like carbon material may be doped with different elements, such as Au, Mo, Fe, Cr and others.

In certain embodiments, a material which is applied as a coating onto a core of a tip of an electron source and which forms at least a portion of its surface is a metal. The metal also may have an oxide layer that decreases the work of emission for electrons in some situations. Examples of metals include Ti, Pt, Al, W, WTi, V, Hf, Zr and others as well as oxides of these, such as $TiO_x$, $VO_x$, $HfO_x$, $ZrO_x$ and others.

In some embodiments, the material which is applied as a coating onto a core of a tip is a semiconductor material. Examples of semiconductor materials include Ge and/or GaAs.

In certain embodiments, an electron beam source includes a tip fixed at a base and extending away from the base. The tip includes a core having a surface formed of a first material. The tip also includes a coating formed of a second material. The second material is applied to the core. The second material at least partially forms a surface of the tip. A first electrical terminal is electrically connected to the coating. An extraction electrode has an opening arranged opposite to the tip. A second electrical terminal is electrically connected with the extraction electrode.

In some embodiments, a surface of the base includes a convex surface portion extending around an end of the tip close to the base. The convex surface contributes to favourably shaping an electric field for emitting electrons from the tip.

In certain embodiments, a radius of curvature associated with the convex surface portion of the base is between 10 μm and 0.1 μm (e.g., between 3 μm and 0.3 μm, between 0.6 μm and 0.4 μm).

In some embodiments, the base has a surface portion having a surface shape of axial symmetry relative to an axis of symmetry. An angle between the axis of symmetry and a longitudinal direction of the tip is less than 10°. This further ensures that the electric field around the tip which generated when suitable electric potentials are applied to the base and to the extraction electrode is favourably shaped for emitting electrons from the electron source.

In certain embodiments, a tip including a coating on a core may be employed as tip of an electron beam source. The electron beam source is integrated in an electron beam system that includes among the source one or more beam shaping components, such as an aperture, an electron optical lens, a beam deflector or the like. The tip may be used to generate an image of an object using electrons. For example, the tip may be used to generate of one or more primary beams of an electron microscopic system.

In some embodiments, the tip may be used to generate one or more writing beams to expose a beam sensitive layer with a predetermined pattern. For example, the tip may be used in an electron lithography system.

In certain embodiments, the second material of the coating which forms a surface of the tip includes more than 30% by weight of at least one lanthanide element, and the source further includes a magnet configured to generate a magnetic field at the tip. With such configuration, it is possible to generate a beam of polarized electrons. In general, in a beam of polarized electrons, a number of electrons having spins oriented in one direction is higher than a number of electrons having spins oriented in a direction opposite to the one direction. According to exemplary embodiments herein, the second material includes more than 30% by weight of Gadolinium. Optionally, the source includes a cooler, such as a Peltier element, configured to cool the tip below a Curie temperature of the second material.

According to some embodiments, a source including a magnet is included in a system which also includes a lens configured to focus a beam of electrons generated by the source in a sample plan, and at least one pair of electron detectors symmetrical arranged relative to an axis of symmetry of the lens.

In certain embodiments, a method for manufacturing an electron beam source is provided. The method includes growing a core from a first material onto a base using deposition, and applying a coating from a second material onto the core. In some embodiments, the deposition may include electron beam induced deposition, ion beam induced deposition, growing the base from amorphous carbon, from a local catalyst, which was for example applied using a lithography method or ion deposition, and other methods.

BRIEF DESCRIPTION OF THE DRAWINGS

Embodiments of the disclosure are subsequently explained in more detail referring to drawings, in which.

DETAILED DESCRIPTION

Exemplary embodiments of the disclosure are explained below in the context with the Figures. Thereby, components corresponding to each other with respect to their structure and function are denoted by the same numeral but are denoted for distinction with an additional letter. For explaining the components it is therefore also referred to the entire respective preceding or succeeding description.

Figure 1:
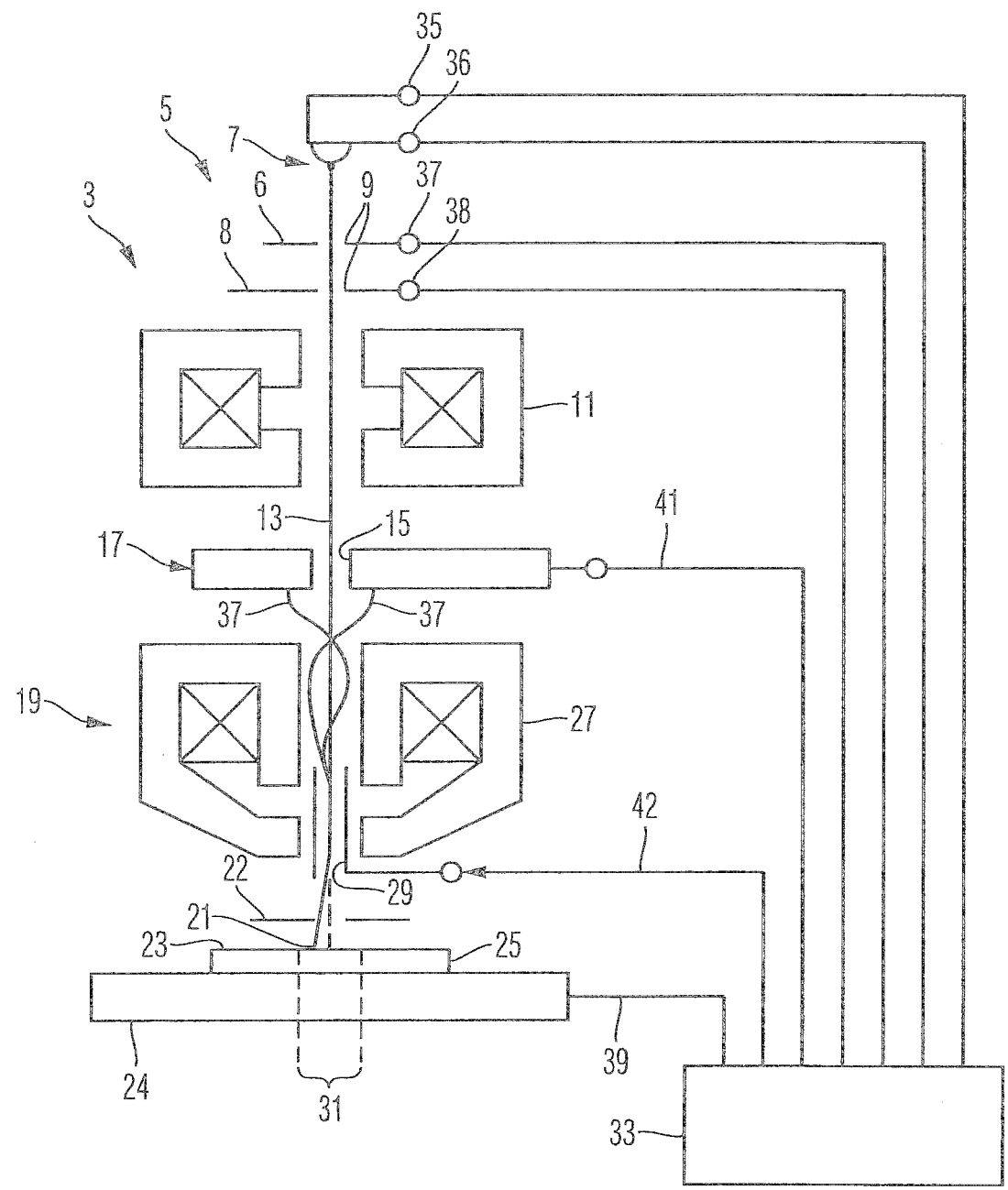
FIG. 1 is a schematic illustration of an electron beam system.

FIG. 1 is a schematic illustration of an electron beam system. The electron beam system 3 includes an electron beam source 5 having a cathode 7 which is described in more detail below, and having two successively arranged anode apertures 6 and 8 each providing an opening 9. The two electrodes 6 and 8 are arranged close to the cathode such that the openings 9 are arranged opposite to a tip of the cathode and such that the openings 9 are traversed by an electron beam 13, when the source 5 is operated. The electron beam 13 generated by the source 5 traverses a condenser lens 11 and an opening 15 in a secondary electron detector 17 and is directed onto a location 21 at a surface 23 of an object 25 by further electron optics 19. In the schematic illustration of FIG. 1 electron optics 19 include a magnetic objective lens 27 and may further include magnetic or electrostatic lenses and electrodes which are not illustrated in FIG. 1. Optics 19 further include deflectors 29 to deflect the electron beam 13 from its straight propagation so that the electron beam may be directed to selectable locations 21 within an extended region 31 at the surface 23 of the object 25.

The electrons of the electron beam 13 release secondary electrons at the location 21 at which they impinge onto the object. The secondary electrons are accelerated away from the surface 23 of the object 25 by an electrode 22 at which an appropriate voltage is applied and the secondary electrons enter into the objective lens 27. Exemplary trajectories of such secondary electrons are denoted by reference sign 37 in FIG. 1. A portion of the secondary electrons impinges at the detector 17 and is detected there.

A controller 33 is configured to supply, via lines 35, 36, a current through the cathode 7 of the electron source 5, to heat the same if desired. In general the cathode may be operated without heating. The lines 35, 36 further serve to apply a predetermined electrical potential, for example referred to ground potential, at the tip of the cathode 7. Lines 37 and 38 serve to apply a respective predetermined electrical potential with respect to the tip of the cathode 7 to the two electrodes 6 and 8, so that an emission of electrons from the tip is assisted and so that a distribution of the electrical field in the region of the tip favourably causes forming the beam 13 from the electrons emitted from the tip. Via a line 39 a predetermined electrical potential with respect to the anode 7 is applied by the controller 33 to a holder 24 for the object 23 and thus to the object 23 itself so that the electrons of the beam 13 impinge at the object 25 with a predetermined kinetic energy. The secondary electrons thereby released and impinging onto the detector 17 generate signals in the detector which are read out from the controller 33 via line 41. Via control line 42 the controller 33 controls the deflector 29 to shift the location 21 at which the electron beam 13 impinges onto the object 25. By recording the signals supplied by the detector 17 depending on the deflection of the electron beam 13 it is possible to gain electron microscopic image information from the object 25.

As far as described above the electron beam system 3 has the function of an electron microscope of type SEM (scanning electron microscope). However, some embodiments also include other types of electron beam systems, such as for example electron microscopy systems of type LEEM (low electron emission microscope) and of type TEM (transmission electron microscope). Certain embodiments include lithography systems in which one or more electron beams are employed to expose a beam sensitive layer (resist) with a predetermined pattern. Hereby, an electron beam may again systematically be scanned in the way described in the context of FIG. 1 across the beam sensitive layer and may thereby be controlled in its intensity, to expose selective regions of the beam sensitive layer with the energy of the impinging electrons. The intensity of the beam impinging onto the layer may thereby be varied by controlling the source or a separate beam blanker may be provided to switch the beam on and off. The beam sensitive layer exposed in this way may subsequently be developed and may be subjected to further lithographical steps, such as for example ion implantation, sputtering or material deposition, to manufacture miniaturized components.

Figure 2A:
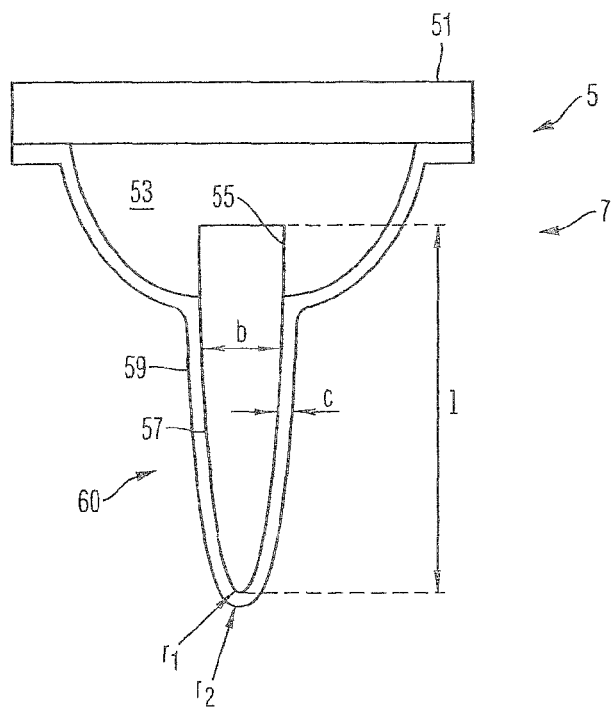
FIG. 2A is a schematic sectional illustration of an electron beam source used in the electron beam system of FIG. 1.

FIG. 2A is an illustration of a detail of the electron beam source 5 in a cross section. The electron beam source 5 of the embodiment shown here includes a carrier plate 51 which may for example be formed from metal through which also a current may flow to heat the cathode. The carrier plate 51 has a terminal for a control line to apply a predetermined electrical potential relative to other components in an electron beam system to the cathode.

A base 53 is fixed at the plate 51 in which base a cylindrical recess 55 is provided. A material for the base 53 may for example be silicon, and the recess 55 may for example be realized by etching into the body of the base 53. A core 57 of a tip 60 of the cathode 7 is fixed in the recess 55. The core may be formed from an electrically substantially non-conductive material. For example its electrical conductivity may be less than $10^{-6}$ S/m. In the embodiment illustrated here the core is made from diamond like carbon. One possibility to manufacture the core 57 made of diamond like carbon is the application of an electron beam induced deposition. In this method the base is placed into a vacuum chamber in which a predefined atmosphere of process gas prevails for which for example carbon compounds may be employed. In this method further an electron beam is directed to the bottom of the recess 55 to start the deposition of diamond like carbon at this location. By selectively directing the electron beam onto those locations at which at a given moment during the process carbon material should be deposited the process gas is exited to deposit carbon atoms at the surface such that these at least partially form an $sp^3$-bond with carbon atoms already deposited at this location. Hereby it is also possible, to choose the process gas such that the depositing material contains (besides carbon) dopants, such as for example hydrogen.

In the example described here the deposition was controlled such that the core 57 has a dimension 1 in a direction extending away from the base 53 of about 560 nm. Further, the deposition was designed such that the core has a substantially round cross section, namely with a maximal dimension b orthogonal to the longitudinal direction of about 150 nm close to the base, wherein the cross section of the core 57 continuously tapers towards its end distant from the base 53. At the end distant from the base 53 the core has a radius of curvature r1 at the surface of about 13 nm.

Using the described method the tip may be grown on the base with a high angular velocity. A longitudinal axis of the tip may for example be oriented such that it includes an angle of less than 0.5° with a symmetry axis of the base and may be spaced apart from the symmetry axis of the base less than 0.1 mm.

A surface of the core 57 is coated with a conductive coating 59 from Ti and $TiO_x$. This coating has a coating thickness c of 10 nm and was for example applied onto the core 57 by sputter coating or electron beam evaporation. This coating also extends across the surface of the base 53 up to the plate 51 so that a comparatively good electric connection is established between the plate 51 and the end of the tip 7 distant from the base 53. In the state schematically illustrated in FIG. 2A also the end of the core 57 pointing away from the base 53 is covered with the coating 59 so that an outer surface of the cathode 7 has a radius r2 of curvature of about 23 nm at this end.

Figure 2B:
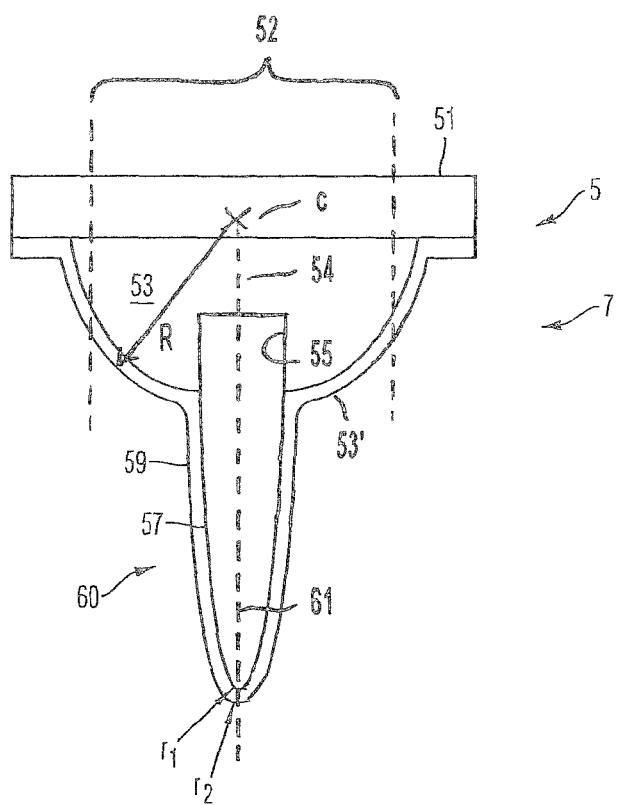
FIG. 2B schematically illustrates geometric properties of the electron beam source shown in FIG. 2A and employed in the electron beam system of FIG. 1.

FIG. 2B illustrates further geometrical properties of the electron beam source 5 of FIG. 2A. The base 53 has an exposed surface 53', wherein the exposed surface 53' is provided by the conductive coating 59. Other surface regions of the base 53 may be exposed during manufacturing the electron source, such as for example the recess 55 at which the tip 60 is fixed. However, the recess 55 is not exposed in the completed electron source. A region 52 defines a portion of the exposed surface 53' of the base 53. This surface portion may amount to at least 50%, such as at least 80%, of an entire exposed surface 53' of the base. The thus defined surface portion extends around an end of the tip 60 close to the base 53. This surface portion has a convex shape. However, not the entire exposed surface 53' of the base need to be convex.

The shape of the convex surface portion of the surface 53' of the base 53 may be approximated by a spherical surface by fitting a sphere having a center C and having an appropriate radius R at the convex surface portion, as illustrated in FIG. 2B. In the illustrated example the best fitting sphere has a radius R=0.5 μm which corresponds to a radius of curvature of the surface portion of the exposed surface 53'. In other embodiments the radius of curvature R may be between 0.1 μm and 10 μm.

In the illustrated example the shape of the surface portion of the base 53 around the tip 60 is axially symmetric having a symmetry axis 54. The symmetry axis coincides with a longitudinal axis 61 of the tip 60. In other embodiments the base may be rotationally symmetric having a symmetry axis. In other embodiments the longitudinal axis 61 of the tip 60 and the symmetry axis 54 of the base 53 include an angle of less than 10°.

Figure 3:
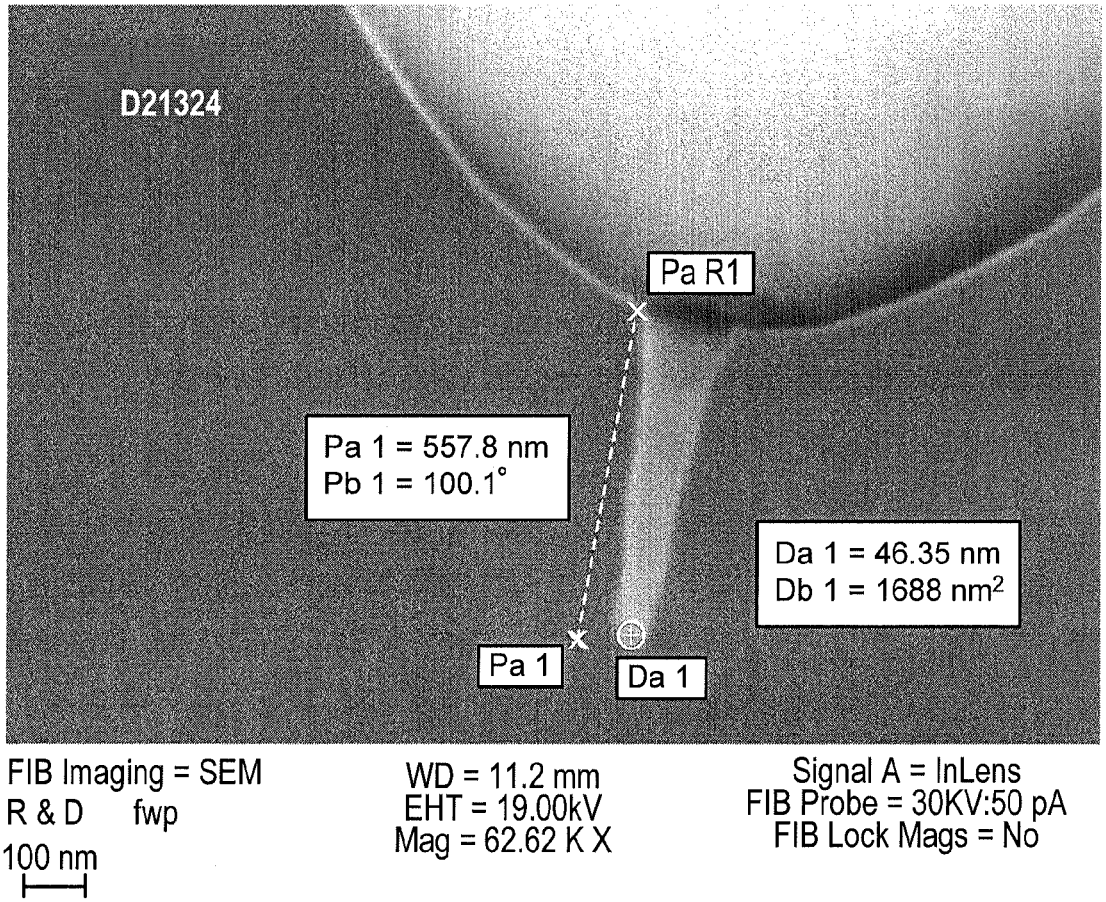
FIG. 3 is a photograph of a tip of the electron beam source schematically illustrated in FIG. 2A.

FIG. 3 shows a photograph of the cathode 7 described above with reference to FIGS. 2A and 2B.

A cathode of the constitution shown in FIG. 3 is capable of generating an electron beam of comparatively large intensity over a relatively long time. In a performed experiment a beam current of 3 μA was achieved and could be maintained over a time span of 1500 hours. Thereby, the beam current stayed comparatively constant, wherein maximum current oscillations of 10% occurred, while current oscillation were less than 3% over a time span of some minutes.

An explanation of the capability of the construction shown in FIG. 2 as electron beam source is still not entirely possible by the inventors. According to speculations an explanation may be seen in that the manufactured construction has a relatively large ratio between length and width and a small radius at the tip so that a favourable amplification of the electrical field results there. Another reason may be that the material of the core has a large durability and resists bombardment by ions of a residual gas in the vacuum chamber present around the tip during a long time, wherein the bombardment occurs during the operations. Even if the coating 59 at the end of the tip is degraded due to such a bombardment a good emission of electrons may nevertheless occur, since the tip conducts the electrons across the coating 59 extending cylindrically around the core 57 up to the end of the tip. According to further considerations the electrons emitting from the tip move within the conductive coating having the form of a face of a circular ring in which states of the electrons are quantized. The energy levels for electrons in the coating resulting thereby are occupied such that the work of emission from the coating is relatively low for electrons residing in one of the higher occupied energy levels or such that a tunnelling probability for electrons out of the tip is relatively high.

Figure 4:
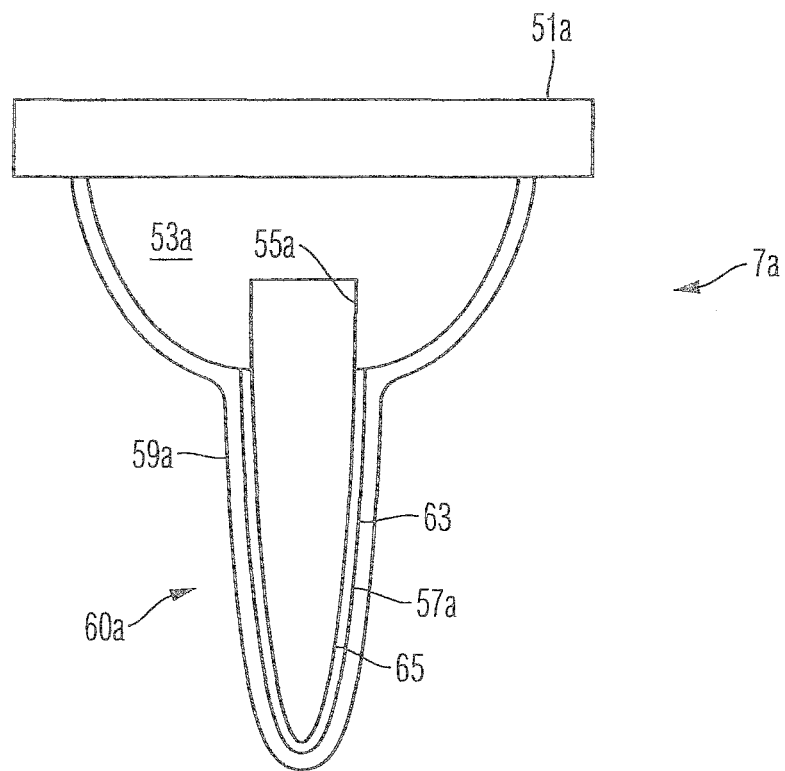
FIG. 4 is a schematic sectional illustration of an electron beam source.

FIG. 4 shows a further embodiment of a tip 60a for an electron beam source 7a. The tip 60a shown in FIG. 4 has a similar construction and a similar function as the tip explained referring to FIGS. 2A and 2B. In contrast thereto, however, the core 57a is however not integrally formed from a single material piece. Rather, the core 57a has an inner core 65 having a longitudinally extending shape and having a rounded surface at its end distant from a base 53a. The inner core 65 is coated with a layer 63 from a non-conductive material. The layer 63 is further coated with a coating 59a from conductive material so that the coating 59a extends up to the end of the core 57a distant from the base 53a and further extends up to a plate 51a at which the base 53a is held to provide a conductive connection between the plate 51a and the end of the core 57a distant from the base 53a.

Similar to FIGS. 2A and 2B, the tip 60a thus includes a conductive coating 59a at least partially providing its surface, wherein the coating 59a is applied in a region of the tip onto a non-conductive material 63. Therefore, it is possible that the inner core 65 is formed from a material which itself is conductive or non-conductive.

Exemplary materials for the inner core are diamond like carbon, exemplary materials for its layer 57a are $SiO_2$ and exemplary materials for the outer coating 59a are Ti and $TiO_X$.

Figure 5:
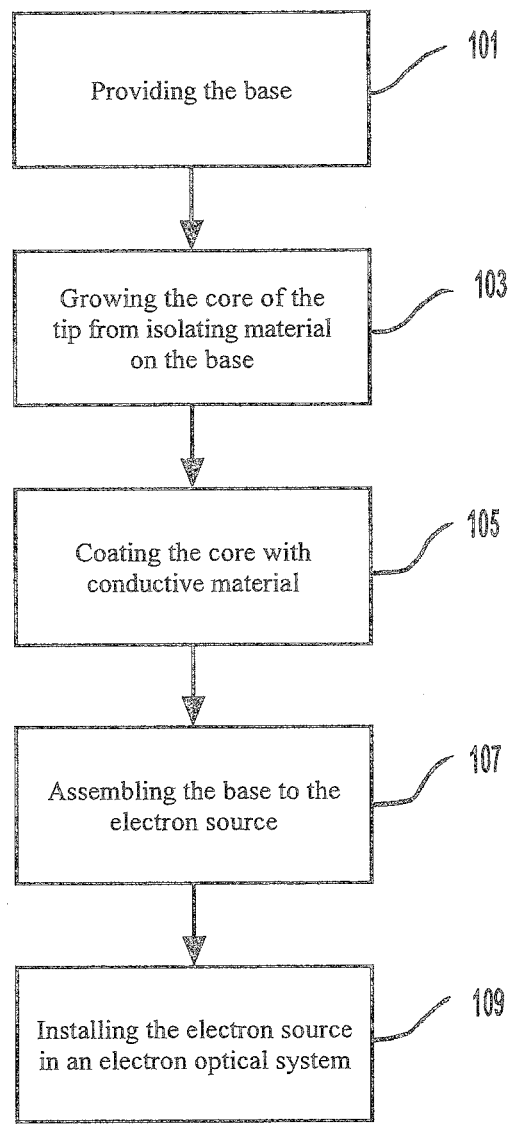
FIG. 5 is a flow diagram for a method of manufacturing an electron beam source.

A method for manufacturing an electron beam source is explained below referring to FIG. 5. The method starts with a step 101 in which a base is provided at which an appropriate tip is fixed in the subsequent steps. Therefore, in a step 103, a core of the tip is grown on the base. In FIGS. 2A, 2B and 4, the base exhibits a recess in which the growing core is fixed. However, it is also possible to grow the core directly on a smooth surface of the base, i.e. not in a recess of the same, such that the core is sufficiently fixed at the base. After growing the core of the tip such that it exhibits a desired length, a desired cross section and a desired tapering towards its end distant from the base, if desired, the core is coated with a conductive material in a step 105. With step 105 a method for manufacturing a tip for an electron beam source according to an embodiment of the disclosure is completed.

The method for manufacturing the electron source according to the embodiment of the disclosure explained here includes a subsequent further step 107 in which the tip with the base is assembled to an electron source. Thereby, one or more apertures are arranged relative to the base such that the aperture is located opposite to the tip so that, upon applying an electrical voltage between the aperture and the base, a distribution of the electrical field between the aperture and the tip results such that electrons can be extracted from the tip and formed into a beam. With the assembly into the electron beam source in the step 107 an embodiment of the method for manufacturing an electron beam source is completed.

In contrast, manufacturing an electron beam system still includes a further step 109 in which the electron beam source is installed into such an electron beam system. The electron beam system may for example be an electron microscopy system or an electron lithography system.

The core may be deposited onto the base by electron beam induced deposition. However, it is also possible to employ other methods for deposition onto the base, such as for example catalytically growing amorphous carbon. Further, it is possible to also manufacture the core with a tip of a small tip radius in that an initially larger blank is reduced in its dimension by directed ablation. Examples of such methods are milling processes using gallium ions or argon ions.

It is further possible to use a tip such as one employed for a scanning tunnelling microscope or an atom force microscope as core for a tip of an electron beam source according to an embodiment of the disclosure. An example is an AFM probe which may be purchased from the company nano-tools GmbH, 80469 Munich, Germany. Then the step 105 of coating with a conductive material is still to be applied to the thus obtained core to obtain a tip for an electron beam source according to an embodiment of the disclosure.

In some embodiments, a tip of an electron beam source includes a core carrying a coating. The coating is formed from a material having a greater electrical conductivity than a material forming the surface of the core.

Figure 6:
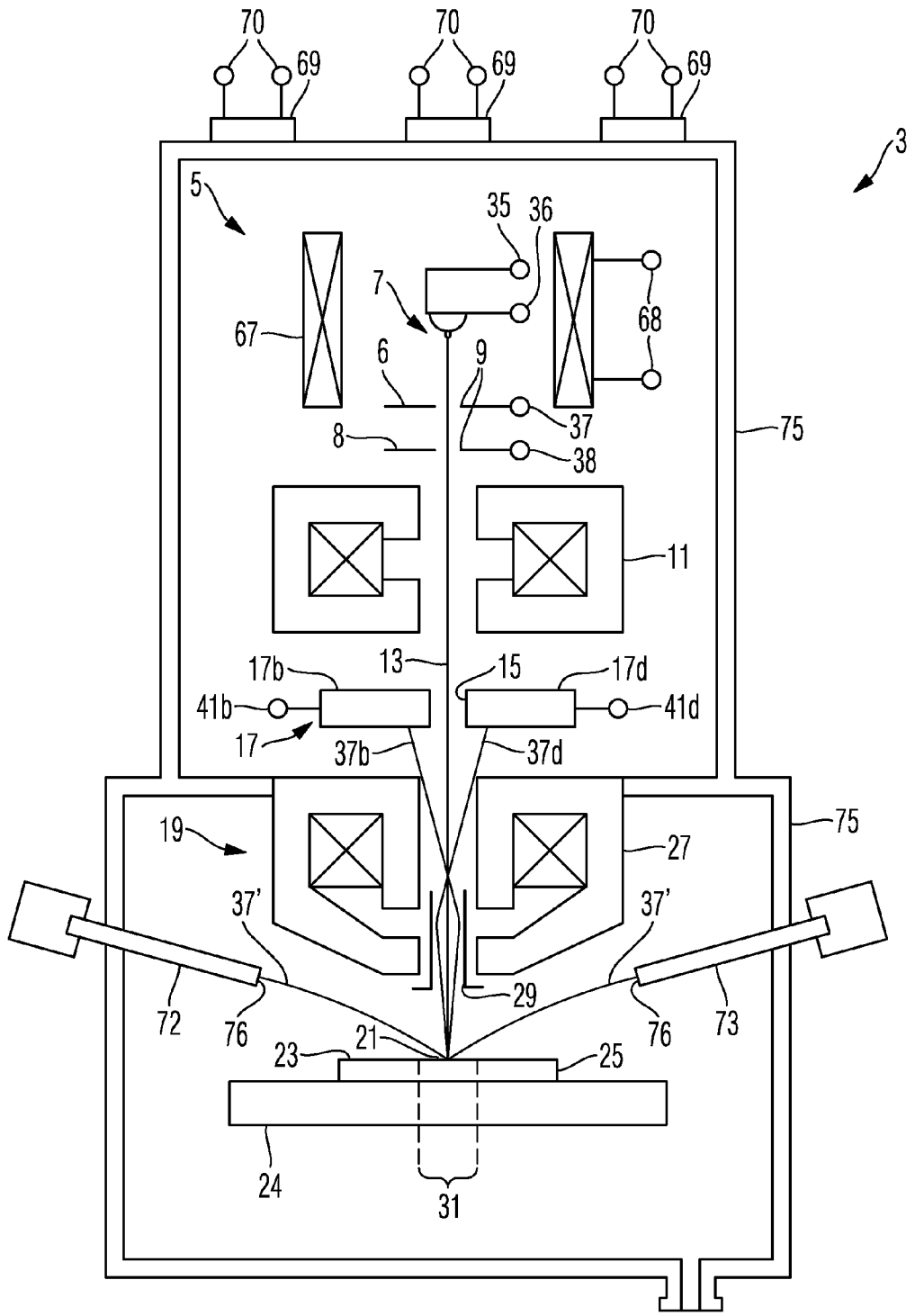
FIG. 6 is a schematic illustration of an electron beam system.

FIG. 6 is a schematic illustration of an electron beam system 3, which has a configuration similar to the electron beam system illustrated with reference to FIGS. 1 to 5 above. The electron beam system 3 shown in FIG. 6 is configured to generate and use a polarized electron beam. For this purpose, an electron beam source 5 includes a cathode tip 7 having a core and a conductive coating as illustrated above with reference to FIGS. 2 to 5. The source further includes a magnet 67 configured to generate a magnetic field at the tip 7 of the electron beam source 5. In the illustrated example, the magnet 67 is an electromagnet provided by a coil of insulated wires which is connected to a controller (not shown in FIG. 6) of the system 3 via electrical connectors 68. The tip 7 of the source 5 is located within a bore of the magnet 67. The magnet may be integrated with pole pieces (not shown in FIG. 6) focusing a magnetic field generated by the magnet at the tip 7. For example, such pole pieces may provide a gap, similar to gaps provided by pole pieces of the condenser lens 11 and the objective lens 27 shown in FIG. 6. The magnet 67 can be energized by the controller such that a magnetic field strength provided at the tip 7 is greater than 0.5 Tesla (e.g., greater than 1 Tesla, greater than 1.5 Tesla). By reversing the current supplied to the coil, it is possible to change an orientation of the magnetic field applied to the tip.

As illustrated above, the tip 7 includes a core having a surface including a first material and a coating applied to the core, where the coating includes a second material having a higher electrical conductivity than the first material. In the illustrated example, the second material providing the coating of the core includes more than 30% by weight (e.g., more than 50% by weight, more than 75% by weight, more than 90% by weight, more than 95% by weight) of at least one lanthanide element. For example, the second material may include more than 30% by weight of Gadolinium. For example, the coating can be provided by pure Gadolinium. In some embodiments, the second material includes more than one lanthanide element.

The electron beam system 3 further includes a cooler, such as one or more Peltier elements 69 or a reservoir of liquid nitrogen, to cool the tip 7 such that its temperature is below a Curie temperature of the second material providing the coating of the core. For this purpose, the Peltier elements or the liquid nitrogen reservoir are thermally connected by a suitable heat transfer path (not shown in FIG. 6), such as a metal rod or cord, to the tip 7. The Peltier elements 69 shown in FIG. 6 are driven by the controller of the system 3 via terminals 70, such that the controller can selectively adjust the temperature of the tip to be above the Curie temperature or below the Curie temperature of the second material providing the coating of the tip 7.

In order to generate a polarized beam of electrons, the tip 7 is heated such that its temperature is above the Curie temperature of the second material. Such heating can be achieved by reducing power supplied to the Peltier elements 69 and/or by supplying a heating current to the tip via terminals 35 and 36. When the temperate of the tip 7 is above the Curie temperature of the coating, the magnet 67 is energized to generate a magnetic field at the tip and to orient the lanthanide element(s) included in the second material. Thereafter, the temperature of the tip is reduced to below the Curie temperature of the second material while the magnetic field is maintained. The cooling of the tip can be achieved by increasing the power supplied to the Peltier elements 69 and/or by reducing a heating current supplied to the tip via terminals 35, 36.

When the tip is oriented in the magnetic field below the Curie temperature, the tip can emit a polarized electron beam 13 by applying suitable extraction fields to electrodes 6 and 8.

The lanthanide element(s) included in the tip 7 remain oriented and can emit the polarized electron beam 13 even if the magnetic field is reduced or switched off after polarization of the tip, as long as the temperature of the tip is continuously maintained below the Curie temperature of the second material.

The polarized electron beam 13 can be advantageously used to inspect samples 23 having magnetic properties and to obtain information relating to the magnetic properties of the sample 23. Such information is obtained by detecting secondary electrons and backscattered electrons released from the sample due to the incident polarized electron beam 13. The detection can be performed by a single detector configured to determine a polarization of the detected electrons. The detection can also be performed by a pair of detectors arranged at opposite sides of the sample, wherein the detectors of the pair differ with respect to a polarization of the electrons they can detect. Still further, the information relating to the magnetic properties of the sample 23 can be obtained by directing the polarized electron beam to the sample and detecting backscattered electron and secondary electron intensities, reversing the polarization of the beam, directing the beam of reversed polarization onto the sample and detecting electron intensities generated from the beam of reversed polarization. By comparing the electron intensities detected with the two different polarizations, it is possible to determine information relating to the magnetic properties of the sample.

FIG. 6 shows a pair of detectors 72 and 73 mounted on a vacuum vessel 75 of the electron beam system 3 such that electron receiving surfaces 76 of the detectors 72, 73 are close to a region 31 of the sample 23 where the polarized electron beam 13 is incident on the sample. Lines 37' in FIG. 6 show exemplary trajectories of secondary electrons emanating from the sample 23 and incident on receiving surfaces 76 of the detectors 72 and 73. When the polarized electron beam 13 is incident on a magnetic sample 23, intensities of scattered electrons will show a directional dependency depending on a direction of orientation of the magnetic field within the sample (see e.g. Daniel T. Pierce, "Spin-Polarized Electron Microscopy", Physica Scripta, Vol. 38, 1988, pages 291 to 296). The detectors 72 and 73 are configured such that they can detect electrons scattered in different directions at the sample 23.

FIG. 6 illustrates a further alternative detection method for obtaining information relating to magnetic properties of the sample. This method uses a detector 17 having an aperture 15 provided upstream of an objective lens 27 of the system 3 in the beam path of the primary electron beam 13 such that the primary beam 13 traverses the aperture 15 provided in the detector 17. As illustrated above with reference to FIG. 1, secondary electrons and backscattered electrons released from the sample 23 can traverse the objective lens 27 to be incident on the detector 17. Reference numerals 37b and 37d in FIG. 6 illustrate exemplary trajectories of secondary and backscattered electrons incident on the detector 17. As it is apparent from FIG. 6, the electron travelling along trajectory 37b is emitted from the surface to an upward right direction and is incident on a left portion 17b of the detector, while the electron travelling along trajectory 37d is emitted to an upward left direction from the sample and is incident on a right portion 17d of the detector. The intensities of electrons emitted to the upward left direction and the upward right direction are different in a situation where the polarized primary electron beam 13 is incident on a magnetic sample. Therefore, a difference in electron intensities detected by detector portions 17b and 17d is indicative of magnetic properties of the sample.

Figure 7:
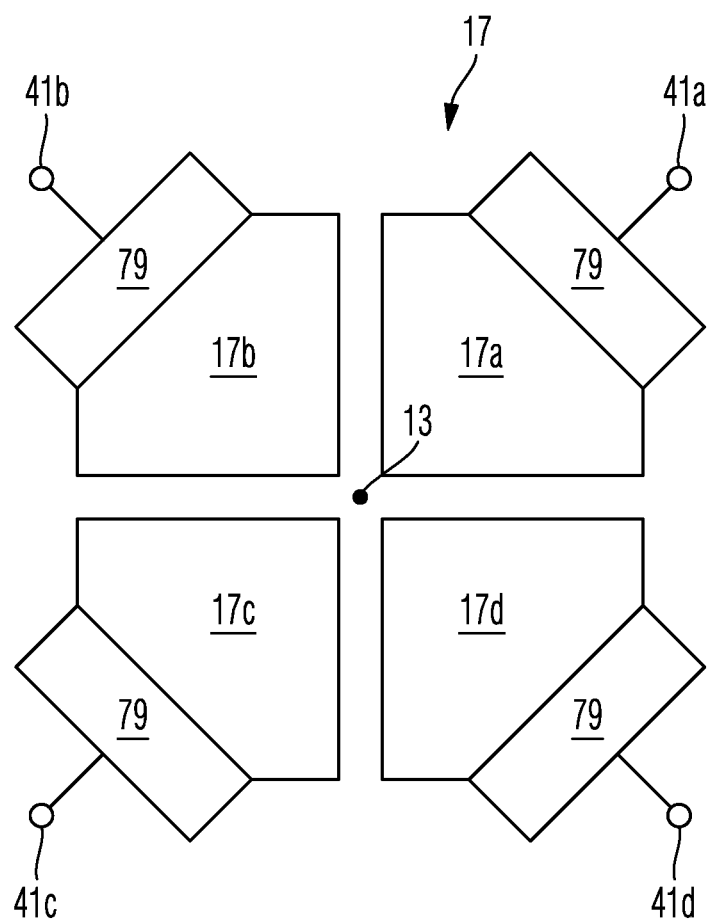
FIG. 7 is an elevational view of a detector used in the system shown in FIG. 6.

FIG. 7 is a more detailed elevational view of detector 17 of the electron beam system 3 shown in FIG. 6. The detector 17 includes four sectors 17a, 17b, 17c and 17d of scintillator material which generates photons upon incidence of secondary or backscattered electrons. Photo multipliers 79 are attached to the sectors 17a, 17b, 17c, 17d of scintillator materials to produce amplified electrical signals at terminals 41a, 41b, 41c and 41d from photons generated by the sectors 17a, 17b, 17c and 17d, respectively. The controller of the electron beam system 3 is connected to the terminals 41a, 41b, 41c and 41d in order to receive the electrical signals generated by the photo multipliers 79 and indicative of the amount of secondary and backscattered electrons incident on the sectors or portions 17a, 17b, 17c, 17d of the detector 17. The controller may store the detected signals and compare the signals generated from different portions of the detector with each other for obtaining the desired information with respect to magnetic structures of the sample 23.

Figure 8:
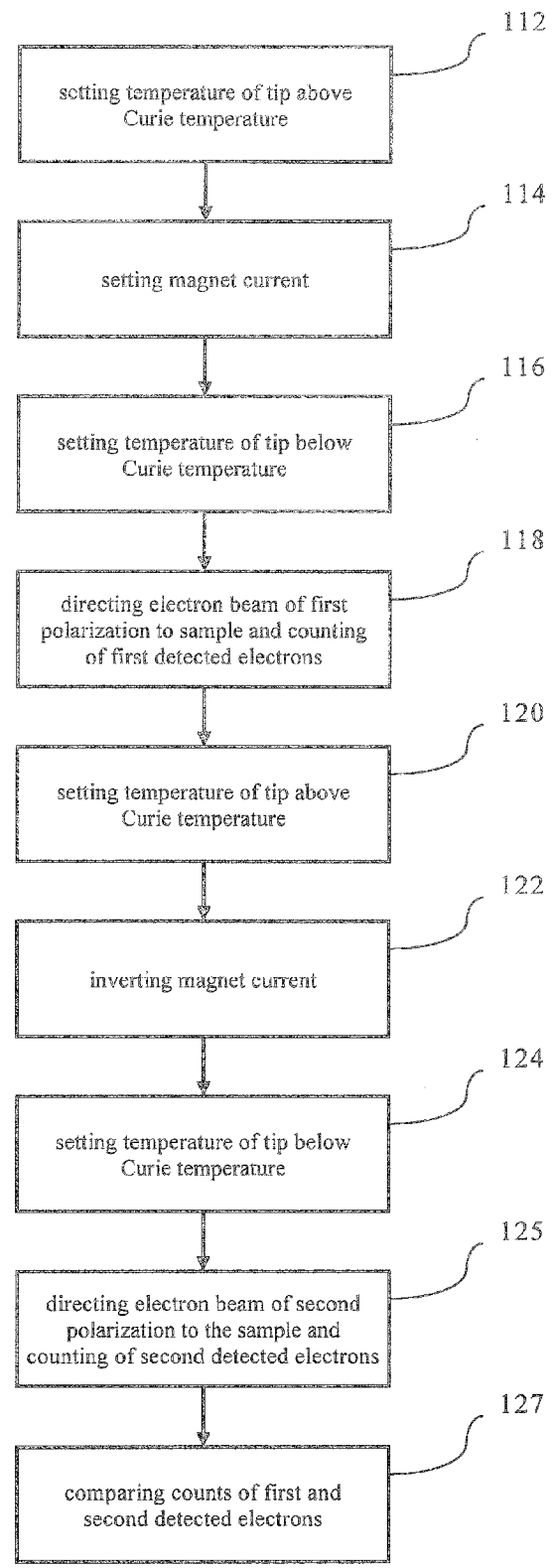
FIG. 8 is a flow diagram of a method of inspecting a sample.

FIG. 8 is a flow diagram of a method of inspecting a sample using an electron beam system similar to that shown in FIG. 6. In a step 112, a temperature of a tip of an electron beam source is set higher than a Curie temperature of a material providing a surface of the tip. A current supplied to an electromagnet generating a magnetic field at the tip is set in a step 114 in order to magnetically orient the material providing the tip. Thereafter, in a step 116, the tip is cooled down to a temperature below the Curie temperature of the material providing the surface of the tip. A polarized electron beam is extracted from the tip and directed to a sample in a step 118, and electron intensities are detected using at least one detector.

Upon completion of inspection of the sample using the polarized electron beam in step 118, the polarization of the beam is reversed and the inspection is repeated with the beam of reversed polarization. For this purpose, the temperature of the tip is again increased to above the Curie temperature in a step 120, the electric current supplied to the magnet is inverted in a step 122, in order to orient the material providing the surface of the tip in a direction opposite to the orientation generated in step 114. Thereafter, the temperature of the tip is reduced to below the Curie temperature of the material providing the surface of the tip in a step 124. A polarized electron beam is extracted from the tip in a step 125, wherein a polarization direction of the beam extracted in step 125 is opposite to the polarization direction of the beam extracted in step 118. The extracted polarized beam is directed to the sample and electrons released from the sample are detected in step 125.

Information relating to magnetic properties of the sample is obtained by comparing the intensities of electrons detected in step 127 with the intensities of electrons detected in step 118. Such comparison may include calculating a difference between the detected electron intensities.

While the disclosure has been provided via certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A source, comprising:
a base;
a tip fixed to the base and extending from the base, the tip comprising:
a core having a surface comprising a first material; and
a coating on the core, the coating comprising a second material, the second material forming a surface of the tip, and the second material comprising more than 30% by weight of a lanthanide element;
a first electrical terminal electrically connected to the coating;
an extraction electrode having an opening; and
a second electrical terminal electrically connected to the extraction electrode,
wherein:
the source is an electron beam source, and the first material is different from the second material; and
at least one of the following conditions is fulfilled:
an electrical conductivity of the first material is less than $10^5$ S/m; and
a ratio of the electrical conductivity of the second material to the electrical conductivity of the first material is greater than 10:1.

2. The source according to claim 1, wherein the lanthanide element comprises Gadolinium.

3. The source according to claim 1, wherein the second material consists essentially of Gadolinium.

4. The source according to claim 1, wherein the second material comprises at least two different lanthanide elements.

5. The source according to claim 1, further comprising a magnet configured to generate a magnetic field at the tip.

6. The source according to claim 5, wherein the magnet comprises a coil having a bore, and the tip is located within the bore of the coil.

7. The source according to claim 1, further comprising a cooler.

8. The source according to claim 7, wherein the cooler comprises a Peltier element.

9. A system comprising:
a source according to claim 1;
a lens configured to focus a beam of electrons generated by the source in a sample plane; and
at least one electron detector.

10. The system according to claim 9, wherein the system comprises at least one pair of detectors symmetrically arranged relative to an axis of symmetry of the lens.

11. A method, comprising:
using a source to generate a first electron beam, electrons in the first electron beam having a polarization with a first orientation, the source comprising:
a base;
a tip fixed to the base and extending from the base, the tip comprising:
a core having a surface comprising a first material; and
a coating on the core, the coating comprising a second material, the second material forming a surface of the tip, and the second material comprising more than 30% by weight of a lanthanide element;
a first electrical terminal electrically connected to the coating;
an extraction electrode having an opening; and
a second electrical terminal electrically connected to the extraction electrode,
wherein the source is an electron beam source, and the first material is different from the second material;
interacting the first electron beam with a sample; and
detecting a first plurality of electrons emerging from the sample as a result of the interaction of the first electron beam with the sample, wherein generating the first electron beam comprises:
setting the tip to a first temperature and applying a first magnetic field to the tip;
then setting the tip to a second temperature lower than the first temperature while maintaining the first magnetic field applied to the tip.

12. The method according to claim 11, wherein the tip is maintained at the second temperature while detecting the electrons emerging from the sample.

13. The method according to claim 11, further comprising:
using the source to generate a second electron beam, electrons in the second electron beam having a polarization with a second orientation opposite the first orientation;
interacting the second electron beam with the sample; and
detecting a second plurality of electrons emerging from the sample as a result of the interaction of the second electron beam with the sample.

14. The method according to claim 13, further comprising comparing an intensity of the first plurality of detected electrons with an intensity of the second plurality of detected electrons.

15. The method according to claim 13, wherein generating the second electron beam comprises:
setting the tip to a first temperature and applying a magnetic field to the tip; and
then setting the tip to a second temperature while maintaining the magnetic field applied to the tip.

16. The method according to claim 13, wherein:
generating the second electron beam comprises:
setting tip to the first temperature and applying a second magnetic field to the tip; and
then setting tip to the second temperature while maintaining the second magnetic field applied to the tip.

17. The method according to claim 16, wherein the second temperature is below 220 K and a magnetic field strength at the tip of the first magnetic field is greater than 0.7 T.

18. The method according to claim 16, wherein the second temperature is below 250 K and a magnetic field strength at the tip of the first magnetic field is greater than 1.0 T.

19. The source according to claim 1, wherein the electrical conductivity of the first material is less than $10^5$ S/m.

20. The source according to claim 1, wherein the ratio of the electrical conductivity of the second material to the electrical conductivity of the first material is greater than 10:1.

21. The method according to claim 11, wherein an electrical conductivity of the first material is less than $10^5$ S/m.

22. The method according to claim 11, wherein a ratio of an electrical conductivity of the second material to an electrical conductivity of the first material is greater than 10:1.

* * * * *